United States Patent
Aouini et al.

(10) Patent No.: US 10,187,197 B2
(45) Date of Patent: *Jan. 22, 2019

(54) OPTICAL CLOCK RECOVERY USING FEEDBACK PHASE ROTATOR WITH NON-LINEAR COMPENSATION

(71) Applicant: Ciena Corporation, Hanover, MD (US)

(72) Inventors: Sadok Aouini, Quebec (CA); Naim Ben-Hamida, Ottawa (CA); Christopher Kurowski, Ottawa (CA); Lukas Jakober, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/042,425

(22) Filed: Jul. 23, 2018

(65) Prior Publication Data

US 2018/0331818 A1 Nov. 15, 2018

Related U.S. Application Data

(63) Continuation of application No. 15/581,676, filed on Apr. 28, 2017, now Pat. No. 10,063,367.

(51) Int. Cl.
| | |
|---|---|
| *H03L 7/00* | (2006.01) |
| *H03L 7/06* | (2006.01) |
| *H03L 7/08* | (2006.01) |
| *H04B 10/40* | (2013.01) |
| *H04L 7/033* | (2006.01) |
| *H04L 25/49* | (2006.01) |
| *H03D 3/24* | (2006.01) |

(52) U.S. Cl.
CPC ............ *H04L 7/0331* (2013.01); *H03L 7/00* (2013.01); *H03L 7/06* (2013.01); *H04B 10/40* (2013.01); *H03L 7/0807* (2013.01); *H03L 2207/00* (2013.01); *H03L 2207/06* (2013.01); *H03L 2207/18* (2013.01)

(58) Field of Classification Search
USPC ....... 375/219, 220, 222, 221, 229–236, 226, 375/240, 240.26, 240.27, 240.28, 240.29, 375/254, 259, 285, 284, 278, 294, 293, 375/295, 296, 306, 307, 308, 312, 354, 375/356, 35, 5, 362, 359, 371, 373, 374, 375/375, 376
See application file for complete search history.

(56) References Cited

U.S. PATENT DOCUMENTS 6,275,554 B1 * 8/2001 Bouillet ................. H04L 7/044
375/321
6,614,840 B1 * 9/2003 Maruyama .......... H04L 27/0014
375/229

(Continued)

*Primary Examiner* — Linda Wong
(74) *Attorney, Agent, or Firm* — Clements Bernard Walker PLLC; Christopher L. Bernard; Lawrence A. Baratta, Jr.

(57) ABSTRACT

A method for clock recovery that may include obtaining an output signal from a phase locked loop (PLL) device. The method may further include determining, using a digital phase detector, the output signal, and a transmitter clock signal, an amount of phase difference between the output signal and the transmitter clock signal. The method may further include filtering, using a phase rotator and a digital accumulator, a portion of the amount of phase difference from the output signal to generate a filtered signal.

20 Claims, 8 Drawing Sheets

(56) References Cited

U.S. PATENT DOCUMENTS

| | | | | |
|---|---|---|---|---|
| 6,683,904 B2* | 1/2004 | Linder | ............... | H04B 1/69 |
| | | | | 375/139 |
| 7,095,287 B2* | 8/2006 | Maxim | ............. | H03L 7/0893 |
| | | | | 331/11 |
| 7,529,320 B2* | 5/2009 | Byrne | ............. | H04L 7/0054 |
| | | | | 375/316 |
| 8,537,955 B1* | 9/2013 | Keane | ............. | H03L 7/0807 |
| | | | | 327/156 |
| 8,576,966 B2* | 11/2013 | Fimoff | ............. | H04L 25/022 |
| | | | | 375/316 |
| 9,479,177 B1* | 10/2016 | Buell | ............. | H03L 7/0992 |
| 2004/0071234 A1* | 4/2004 | Li | ............. | H04L 25/03273 |
| | | | | 375/341 |
| 2004/0196915 A1* | 10/2004 | Gupta | ............. | H04L 27/266 |
| | | | | 375/260 |
| 2007/0286268 A1* | 12/2007 | Kim | ............. | H04L 25/03159 |
| | | | | 375/226 |
| 2008/0292040 A1* | 11/2008 | Menolfi | ............. | H03D 3/006 |
| | | | | 375/376 |
| 2010/0097251 A1* | 4/2010 | Liu | ............. | H03L 7/0812 |
| | | | | 341/111 |
| 2013/0070880 A1* | 3/2013 | Tell | ............. | H04L 7/0012 |
| | | | | 375/354 |
| 2014/0184281 A1* | 7/2014 | Danny | ............. | H03L 7/081 |
| | | | | 327/115 |
| 2015/0365095 A1* | 12/2015 | Hossain | ............. | H03L 7/235 |
| | | | | 327/105 |
| 2017/0085293 A1* | 3/2017 | Marrow | ............. | H04B 1/71637 |

* cited by examiner

OPTICAL CLOCK RECOVERY USING FEEDBACK PHASE ROTATOR WITH NON-LINEAR COMPENSATION

CROSS REFERENCE TO RELATED APPLICATIONS

This application is a continuation of and claims benefit under 35 U.S.C. § 120 to U.S. application Ser. No. 15/581,676, filed Apr. 28, 2017, which is incorporated herein by reference in its entirety.

BACKGROUND

A phase locked loop may produce a synchronized clock signal that has a phase and/or frequency matched with a reference clock source. For example, the synchronized clock signal may be matched to phase and/or frequency information obtained through synchronous Ethernet (SyncE), or from a precision time protocol (PTP), such as a protocol based on the IEEE 1588 standard. Thus, the synchronized clock signal may be used to control various operations performed on a computing system.

SUMMARY

In general, in one aspect, embodiments relate to a system that includes a phase locked loop (PLL) device. The PLL device includes an analog phase detector that obtains a reference signal. The PLL device further includes a voltage-controlled oscillator (VCO) device that generates, based on the reference signal, an output signal. The system further includes a phase rotator coupled to the analog phase detector and the VCO device. The system further includes a digital phase detector. The digital phase detector determines an amount of phase difference between a transmitter clock signal and the output signal. The system further includes a digital accumulator coupled to the digital phase detector. The phase rotator and the digital accumulator, using the amount of phase difference between the transmitter clock signal and the output signal, filter a portion of the amount of phase difference from the output signal to generate a filtered signal for transmission to the analog phase detector.

In general, in one aspect, embodiments relate to an apparatus that includes a phased locked loop (PLL) device. The apparatus further includes a processing system coupled to the PLL device. The processing system obtains an output signal from the PLL device. The processing system further determines, using a digital phase detector, the output signal, and a transmitter clock signal, an amount of phase difference between the output signal and the transmitter clock signal. The processing system further filters, using a phase rotator and a digital accumulator, a portion of the amount of phase difference from the output signal to generate a filtered signal.

In general, in one aspect, embodiments relate to a method for clock recovery. The method includes obtaining an output signal from a phase locked loop (PLL) device. The method further includes determining, using a digital phase detector, the output signal, and a transmitter clock signal, an amount of phase difference between the output signal and the transmitter clock signal. The method further includes filtering, using a phase rotator and a digital accumulator, a portion of the amount of phase difference from the output signal to generate a filtered signal.

Other aspects of the invention will be apparent from the following description and the appended claims.

DETAILED DESCRIPTION

Figure 1:
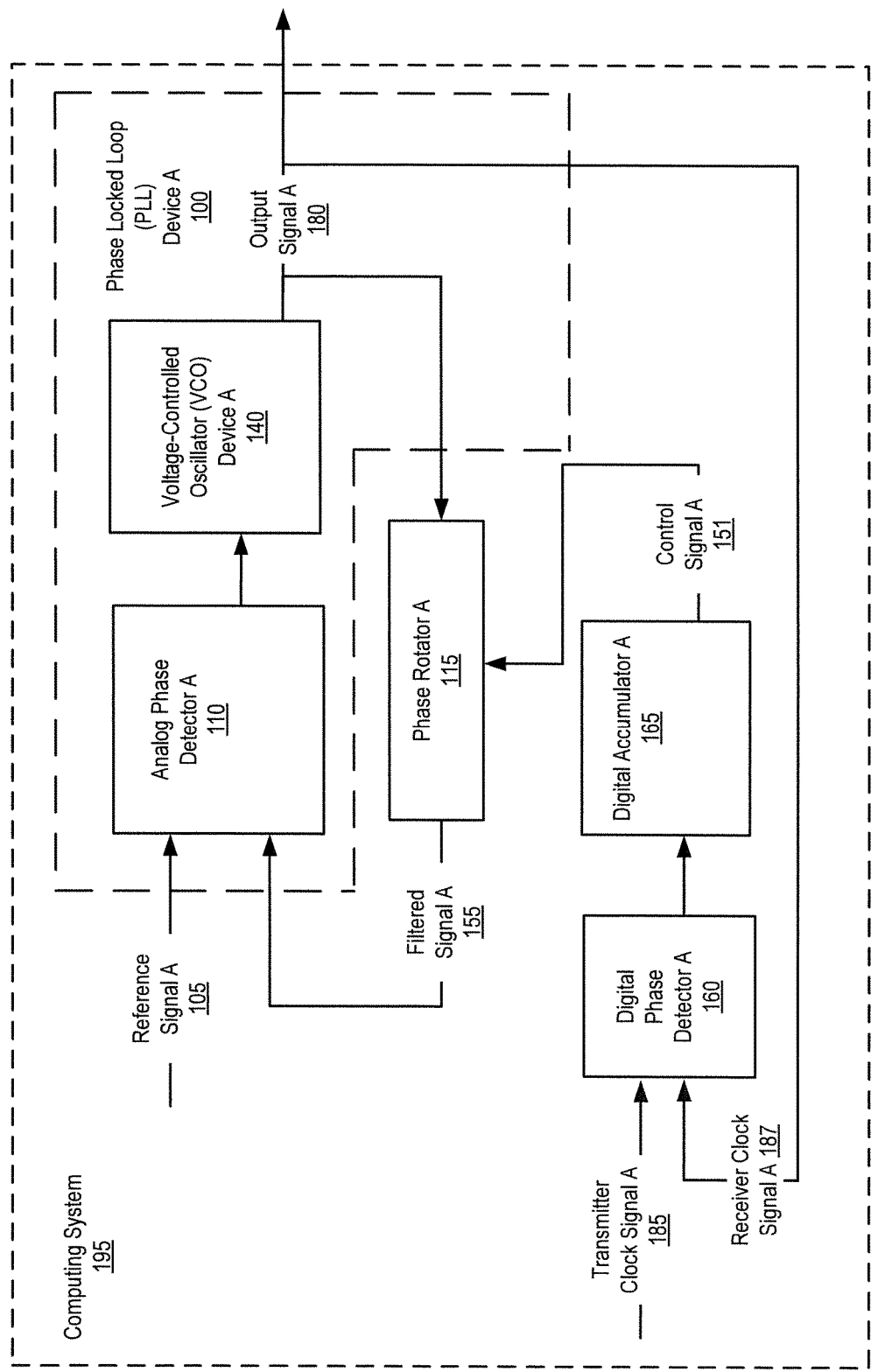
FIGS. 1, 2, 3, 4, and 5 show systems in accordance with one or more embodiments.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the invention include a system, an apparatus, and a method for clock recovery. In particular, one or more embodiments are directed to a clock circuit that includes a phase rotator disposed within a feedback loop of a phase locked loop (PLL) device. In one or more embodiments, the PLL device is an analog PLL device that includes an analog phase detector. The analog phase detector extracts the difference between a voltage-controlled oscillator (VCO) clock and a reference clock. The PLL device further includes a VCO device that generates, based on the reference clock, an output signal.

A digital phase detector coupled to the phase rotator may determine the frequency offset and/or phase misalignment between a transmitter clock signal and a receiver clock signal. For example, the transmitter clock signal may be an extracted clock signal obtained over an optical link at an optical transceiver. In another embodiment, the transmitter clock signal may be an extracted clock signal from a serializer-deserializer (SerDes) system. Likewise, the reference clock signal may be a clock signal locked to an onboard reference clock coupled to the PLL device.

Based on the phase difference between transmitter and reference clock signals, a phase rotator may apply a phase shift correction to reduce the frequency offset and phase misalignment between the clock signals. However, the phase shift correction from the phase rotator may introduce PLL noise, such as jitter, into the feedback loop of the PLL device. Thus, in one or more embodiments, one or more non-linear compensation schemes are included in the clock circuit that includes the phase rotator and the PLL device to account for the PLL noise. In particular, a non-linear compensation scheme may be a circuit combination, for example, coupled to the PLL device that removes PLL noise based on differences between the transmitter and reference clock signals. In one embodiment, for example, the clock circuit may include a lookup table that tunes the phase shift correction of the phase rotator to reduce the PLL noise. In another embodiment, a delay element may be placed in the feedback loop of the PLL device as a jitter-removal mechanism. In another embodiment, a reference clock signal coupled to the PLL device may be independently adjusted to minimize the frequency offset between the transmitter and receiver clock signals and the output signal of the PLL device to be within a specified margin. In a further embodiment, a varactor circuit may be coupled to a voltage-controlled oscillator (VCO) device inside the PLL device to further compensate for the PLL noise produced by the phase rotator.

The analog PLL locks to reference clock with a high bandwidth to reduce VCO phase noise. The phase rotator digital PLL is nested in the loop of the analog PLL and locks to the transmit data. This configuration decouples the requirement for high bandwidth of the analog PLL to reject the phase noise of the VCO from the requirement of the clock recovery bandwidth. The phase rotator based digital clock recovery bandwidth is to optimize jitter tracking vs jitter generation and minimize digital phase detector error through averaging.

The phase rotator based digital clock recovery allows the system to lock to a transmit data generated from a transmit PLL locked to a different reference from the receive PLL.

FIG. 1 shows a block diagram of a system in accordance with one or more embodiments. In one or more embodiments, as shown in FIG. 1, a computing system (195) includes a phase locked loop (PLL) device (100). For example, the computing system (195) may be a computing system as described in FIG. 8 below. The PLL device A (100) may be hardware and/or software that implements a control system with functionality to synchronize an output signal to an input signal. Specifically, the PLL device A (100) may include an analog phase detector (e.g., analog phase detector A (110)) that may be an integrated circuit and include functionality to determine a difference in phase between two input signals (e.g., reference signal A (105) and filtered signal A (155)). While an analog phase detector is shown inside the PLL device A (100) in FIG. 1, an analog phase-frequency detector may be used instead. A phase-frequency detector inside the PLL device A (100) may produce two signals that correspond to the phase difference and the frequency difference rather than a single phase difference signal.

Keeping with FIG. 1, reference signal A (105) may be a voltage signal generated by a reference clock source (not shown). Accordingly, the reference signal A (105) may be a reference clock signal from an onboard or external clock source that locks the phase of the feedback loop of PLL device A (100). Likewise, output signal A (180) in FIG. 1 may be an extracted clock signal obtained using the reference signal A (105). The reference clock source may be software and/or hardware, such as an integrated circuit, that includes functionality for generating and/or transmitting synchronized timing information to the PLL device A (100). For example, a reference clock source may be a crystal oscillator or a global position system (GPS) device in the computing system (195). Other examples of reference clock sources include implementing a network protocol over a network for synchronizing clocks, such as synchronous Ethernet (SyncE), or implementing a precision time protocol (PTP), e.g., with respect to the IEEE 1588 standard.

In one or more embodiments, the computing system (195) includes a phase rotator (e.g., phase rotator A (115)) within a feedback loop of a PLL device (e.g., PLL device A (100)). In particular, a phase rotator may be hardware that includes functionality to adjust a frequency offset and/or phase misalignment of an input signal (e.g., transmitter clock signal A (185)) and a receiver clock signal (e.g., receiver clock signal A (187)). As such, a phase rotator may include one or more hardware components that include functionality to apply a predetermined amount of phase shift to an input signal (e.g., output signal A (180)). In one or more embodiments, the phase rotator decouples a clock recovery bandwidth of a PLL device from a frequency of one or more components of the PLL device (e.g., the VCO device A (140)).

Furthermore, a phase rotator may include a pair of variable gain amplifiers that apply predetermined weights to an in-phase (I) component and a quadrature (Q) component of an input signal. For example, a phase rotator may generate a pair of differential phase signals from the input signal that correspond to the I component (i.e., "I phase signal") and the Q component (i.e., "Q phase signal") of the input signal. In one or more embodiments, for example, the I phase signal and the Q phase signal are expressed using the following equations:

$$Q = A\cos(k\int v(t)dt) = A\cos k\varphi \qquad \text{Equation 1}$$

$$I = A\sin(k\int v(t)dt) = A\sin k\varphi \qquad \text{Equation 2}$$

where Q is the Q phase signal; I is the I phase signal; A is the amplitude of an output signal from the phase rotator, such as filtered signal A (155); k is a gain value in the phase rotator, v(t) is the voltage of the input signal, t is the time domain, $\varphi$ is the phase shift applied to an input signal (e.g., feedback signal A (246) or output signal A (180)) by the phase rotator. The I phase signal and/or the Q phase signal may be generated in by a resistor-capacitor (RC) polyphase network, frequency dividers, and/or a resistor-capacitor pairs, for example. Furthermore, the phase rotator may include an interpolator circuit that generates a linear summation of the I phase signal and the Q phase signal. The phase rotator may then produce an output signal (e.g., filtered signal A (155)) with the applied phase shift.

In one or more embodiments, the I phase signal and the Q phase signal result in an mismatch. For example, the I-Q mismatch may be the result of a feedback divider mismatch if a divider is used to generate the quadrature clocks or a buffer delay mismatch between the paths of the I phase signal and the Q phase signal. Specifically, the mismatch may produce various non-linearities within a feedback loop of a PLL device. The non-linearities may generate PLL noise, such as jitter, into the extracted clock signal (e.g., output signal A (180)). For a further discussion on PLL noise and jitter, see FIG. 6 and the accompanying description below. Likewise, an arctan effect may result from phase interpolation within the phase rotator, and which may also produce various non-linearity within the feedback loop of a PLL device. For example, with linear phase interpolation, the coefficients of quadrature clock signals may be varied in a sinusoidal fashion. However, if the coefficients of the quadrature clock signals are varied in a linear fashion (e.g., $A_{cos}+A_{sin}=1$), the linear phase interpolation in the example may result in a non-linear phase interpolation function. Accordingly, the effect of the non-linear phase interpolation function may resemble an arctan function. Accordingly, in one or more embodiments, various non-linear compensation schemes are described below with respect to FIGS. 2-5 and the accompanying description.

Keeping with FIG. 1, in one or more embodiments, the co phase shift of the phase rotator is determined by a control signal (e.g., control signal A (151)). For example, the control signal may be a binary signal obtained by a multi-bit register that includes functionality to designate the phase rotator to produce no phase shift or one or more steps of phase shift. Likewise, the binary signal may be a data sequence that determines which step of phase shift is produced by the phase rotator (e.g., '101' corresponds to one amount of phase shift and '001' corresponds to a different amount of phase shift). Furthermore, the phase rotator may be a single-step device, e.g., a single amount of phase shift based on the control signal. On the other hand, the phase rotator may be a multi-step device. In a multi-step device, the phase rotator may produce different amounts of phase shift based on a control signal (e.g., control signal A (151)). In one or more embodiments, for example, the phase rotator produces an approximate phase shift of 100 femtoseconds per step. If the control signal A (151) designates two steps, then the phase rotator may produce 200 femtoseconds of phase shift to an input signal.

In one or more embodiments, a control signal for a phase rotator is based on a frequency offset and/or phase misalignment between a transmitter clock signal and a receiver clock signal. For example, the transmitter clock signal A (185) may be obtained using a Godard extraction algorithm. By way of a more specific example, the digital phase detector A (160) may be a Godard digital phase detector that implements the Godard extraction algorithm. In an optical system, for example, the transmitter clock signal A (185) may be extracted from the "out-of-band" spectrum of the transmitted data from the transmitted data by applying the Godard phase extraction process on the "out-of-band" frequency spectrum, i.e., in Godard bins of the upper sideband and lower sideband of transmitted data's frequency spectrum. For more information on extracting the transmitter clock signal received within a data spectrum, see D. Godard, "Passband Timing Recovery in an All-Digital Modem Receiver," IEEE Trans. On Communications, Vol. 26, Issue: 5, May 1978, which is incorporated by reference. While applying a Godard extraction algorithm is one example for obtaining the transmitter clock signal, other timing recovery methods of transmitter clock signals are also contemplated, such as a Gardner timing recovery method.

Furthermore, for example, a control signal for a phase rotator may be generated by a digital accumulator (e.g., digital accumulator A (165)) coupled to a digital phase detector (e.g., digital phase detector A (160)). The digital phase detector (160) may be hardware and/or software that includes functionality to determine a phase difference between two input signals (e.g., transmitter clock signal A (185) and receiver clock signal (187)). The digital accumulator A (165) may be hardware and/or software that includes functionality to store a value of the phase difference, for example, in a hardware register. Thus, in one or more embodiments, the digital accumulator A (165) is an integrated circuit that includes functionality to store various measurements of the difference between a transmitter clock signal and a receiver clock signal.

Turning to the PLL device A (100) of FIG. 1, the PLL device A (100) may also include a charge pump (not shown), a loop filter (not shown), one or more feedback dividers (not shown), a voltage-controlled oscillator (VCO) device (e.g., VCO device A (140)), and various other PLL components not shown. For example, the voltage-controlled oscillator device A (140) may be hardware that includes functionality to generate an oscillating signal. Thus, the voltage-controlled oscillator device A (140) may include functionality to obtain a direct current signal from a loop filter to generate the output signal A (180) with a predefined period and frequency.

Figure 2:
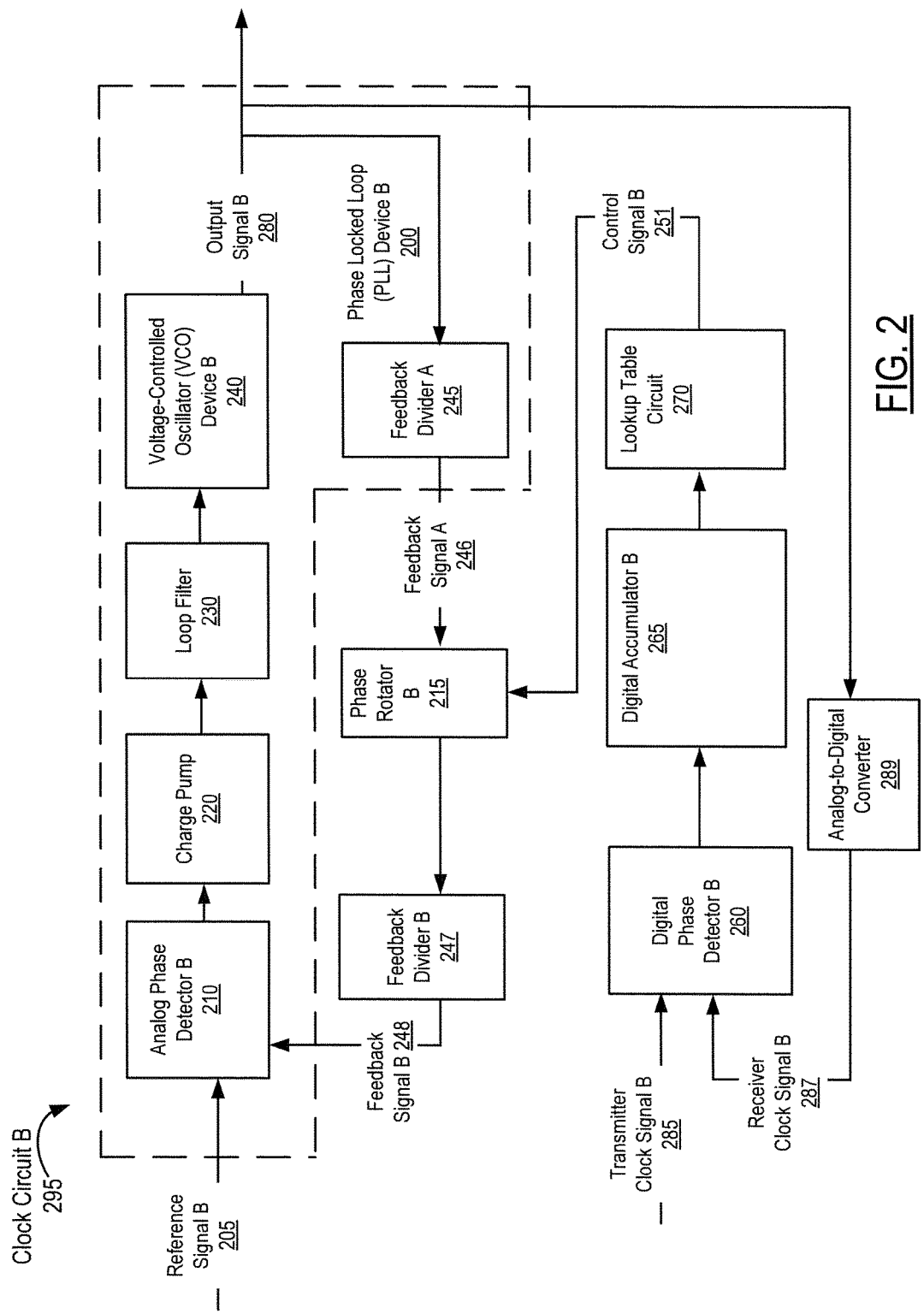

Turning to FIG. 2, FIG. 2 shows a block diagram of a system in accordance with one or more embodiments. In one or more embodiments, as shown in FIG. 2, a clock circuit B (295) includes a PLL device B (200). A clock circuit (i.e., clock circuit B (295)) may be a portion of a computing system (e.g., computing system (195)) that includes hardware and/or software for extracting a clock signal and/or transmitting a clock signal to another computer device. For example, the clock circuit B (295) may include the PLL device B (200) that includes an analog phase detector B (210), a charge pump (220), a loop filter (230), and a voltage-controlled oscillator device B (240). Furthermore, one or more components illustrated in FIG. 2 may be similar to one or more components described in FIG. 1 and the accompanying description (e.g., phase rotator B (215) may be similar to phase rotator A (115), digital phase detector B (260) may be similar to digital phase detector A (160), etc.).

In one or more embodiments, a lookup table circuit (e.g., lookup table circuit (270)) is coupled to a phase rotator (e.g., phase rotator B (215)) in a clock circuit (e.g., clock circuit B (295)) to produce a non-linear compensation scheme. In particular, the lookup table circuit (270) may be hardware and/or software that includes functionality to predistort the phase rotator B (215) based on various values obtained from the digital accumulator B (265). For example, depending on the phase difference between the transmitter clock signal B (285) and the receiver clock signal B (287), the lookup table circuit (270) may determine a corresponding value of the control signal B (251) that results in reduced PLL noise within the feedback loop of the PLL device B (200). In one embodiment, for example, the lookup table circuit (270) may moderate phase shifts applied by the phase rotator B (215) to feedback signal A (246). In one or more embodiments, the phase shift values of the lookup table circuit (270) are based on experimental tests of a phase rotator within a feedback loop of a PLL device.

In one or more embodiments, values of the lookup table circuit (270) are based on measurements of the phase step within the feedback loop of a PLL device. For example, the values of the lookup table circuit (270) may be obtained for each digital code of control signal B (251) that is applied to the phase rotator B (215). The measurements of the phase step may describe the integral non-linearity of the phase rotator B (215), which may be cancelled using the lookup table circuit (270). In one or more embodiments, measurements for the lookup table circuit (270) are obtained only once and before the clock recovery process, for example, at startup or during the chip screening process.

As shown in FIG. 2, the PLL device B (200) may generate an output signal (e.g., output signal B (280)) that is transmitted to a feedback divider (e.g., feedback divider A (245)). A feedback divider may be hardware, such as an integrated circuit, that includes functionality to divide the frequency of an input signal (e.g., output signal B (280)) by an N-multiple. This division by the feedback divider may produce a corresponding feedback signal (e.g., feedback signal A (246), feedback signal B (248)) with an adjusted frequency. For example, the PLL device B (200) may multiply the reference signal B (205) by an N-multiplier to generate the output signal B (280). In the feedback loop of the PLL device (200), feedback divider A (245) and feedback divider B (247) may account for the increased frequency of the output signal B (280) in order to return feedback signal B (248) inputted to the analog phase detector B (210) to a similar frequency as reference signal B (205).

Keeping with FIG. 2, the PLL device B (200) may include a charge pump (220), a loop filter (230), and a VCO device B (240). The charge pump (220) may be hardware that includes functionality to generate a current signal from a voltage signal, e.g., a voltage signal that relates to the phase difference detected by the analog phase detector B (210). The loop filter (230) may be hardware that includes functionality to produce stability within the PLL device B (200) as well as a frequency bandwidth for the type of reference signal B (205) synchronize with the output signal B (280). For example, the loop filter (230) may be a low pass filter that operates on a voltage signal produced by the charge pump (220). Moreover, as the VCO device B (240) may generate an analog signal, an analog-to-digital converter (e.g., analog-to-digital convert (289)) may be hardware and/or software that converts the output signal B (280) to a digital signal before use as a receiver clock signal (e.g., receiver clock signal B (287) or as an input to the digital phase detector D (260).

Figure 3:
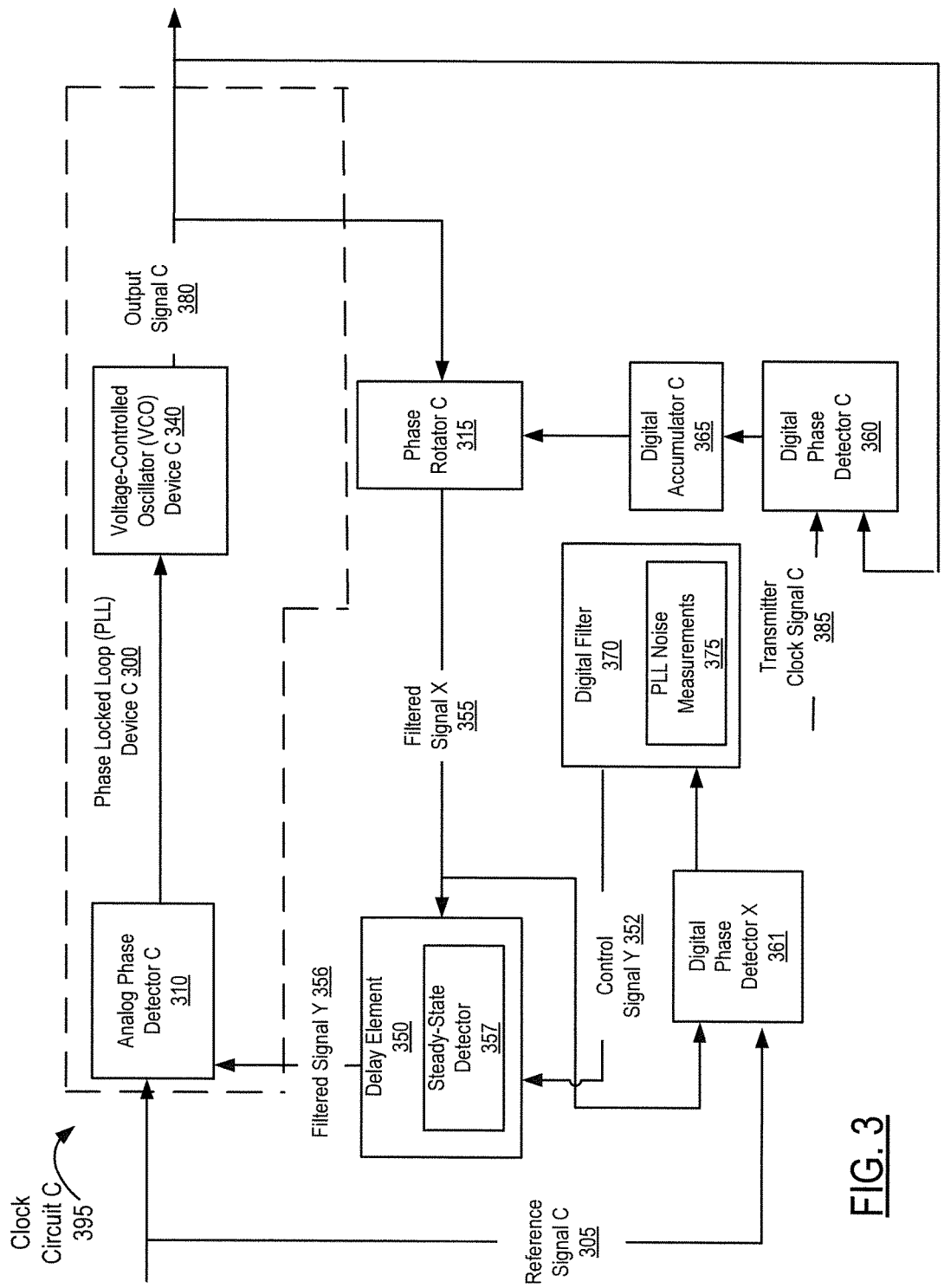

Turning to FIG. 3, FIG. 3 shows a block diagram of a system in accordance with one or more embodiments. In one or more embodiments, as shown in FIG. 3, a clock circuit C (395) includes a PLL device C (300) that includes an analog phase detector C (310) and a VCO device C (340). The PLL device C (300) may be coupled to a phase rotator C (315). Furthermore, one or more components illustrated in FIG. 3 may be similar to one or more components described in FIG. 1 and the accompanying description (e.g., phase rotator C (315) may be similar to phase rotator A (115), digital phase detector C (360) may be similar to digital phase detector A (160), digital accumulator C (365) may be similar to digital accumulator A (165), transmitter clock signal C (385) may be similar to transmitter clock signal A (185), etc.).

In one or more embodiments, the phase rotator C (315) is operably connected to a delay element (350) in a non-linear compensation scheme. In one or more embodiments, for example, a delay element is hardware and/or software that includes functionality to filter noise from an input signal (e.g., filtered signal X (355)) using a digital filter (370) to produce an output signal (e.g., filtered signal Y (356)). The delay element may be a digitally programmable device that includes functionality to adjust the rising edge or falling edge of an input signal (e.g., filtered signal X (355)) within a predefined resolution and/or bandwidth range. Thus, the delay element (350) may remove at least a portion of the noise in the input signal resulting from the operation of the PLL device C (300) and/or the phase rotator C (315). In particular, the phase noise may include phase locked loop (PLL) error, such as jitter, that is produced by various components of the PLL device C (300), such as a charge pump (not shown), a loop filter (not shown), the VCO device C (340), and a feedback divider (not shown). Accordingly, the delay element (350) may remove PLL noise from the phase of the output signal C (380) and/or the filtered signal X (355).

Figure 6:
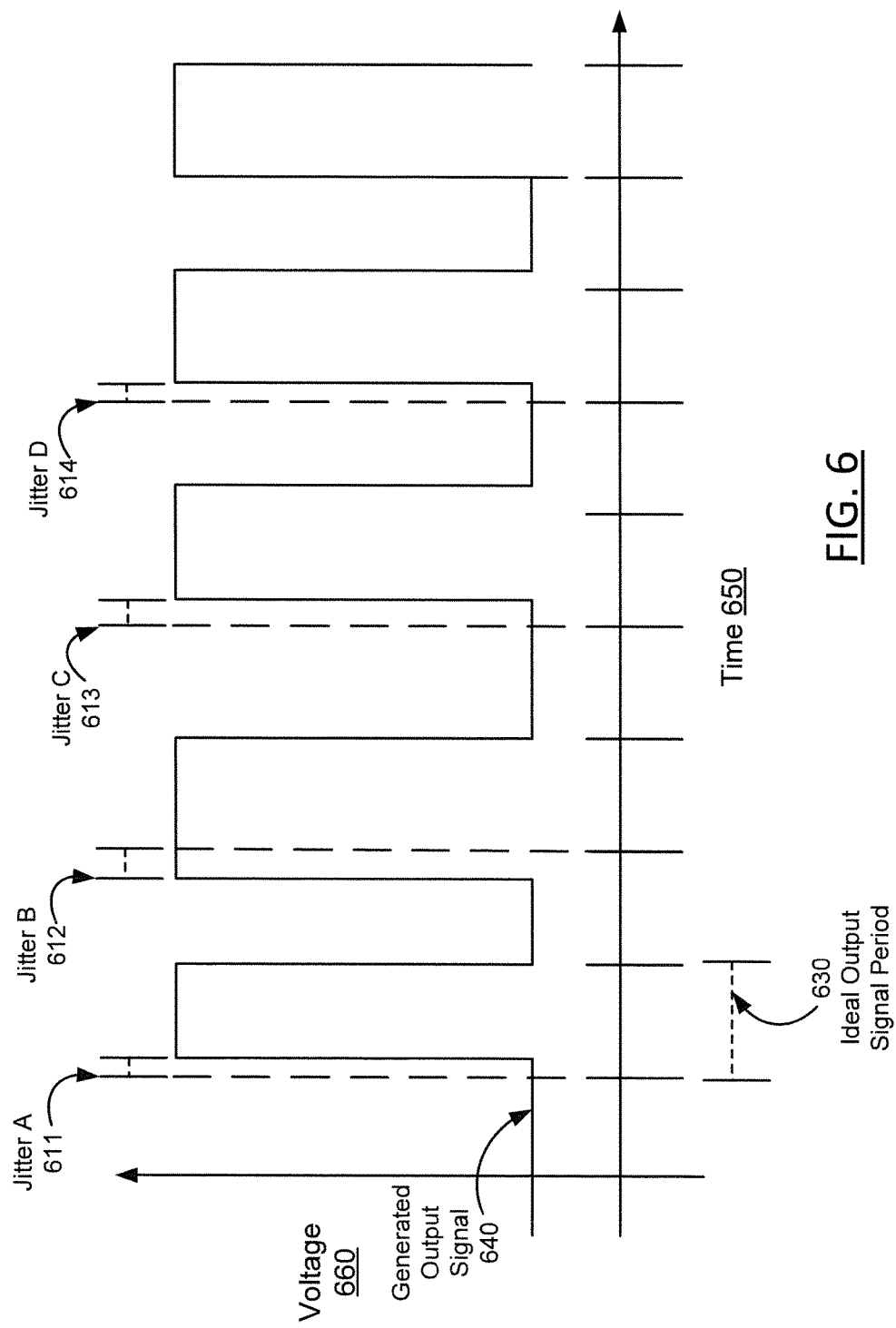
FIG. 6 shows an example of a timing diagram in accordance with one or more embodiments.

Turning to FIG. 6, FIG. 6 shows an example of a timing diagram in accordance with one or more embodiments. As shown in FIG. 6, a generated output signal (640) is compared with an ideal output signal period (630) along an axis (650) with respect to time and another axis (660) with respect to voltage. In particular, the generated output signal (640) includes various amounts of PLL noise (i.e., jitter A (611), jitter B (612), jitter C (613), jitter D (614)) separating the generated output signal (640) from the ideal output signal period (630). Thus, while the ideal output signal period (630) may be approximately constant, various periods within the generated output signal (640) may deviate from the ideal output signal period (630). This deviation may be the result of PLL noise introduced by one or more components in a PLL device, for example. While time-interval error jitter is shown by jitter A (611), jitter B (612), jitter C (613), and/or jitter D (614), other types of jitter may also exist in the generated output signal (630), such as cycle-to-cycle period jitter, long term jitter, phase jitter, and any other forms of phase noise.

Returning to FIG. 3, in one or more embodiments, the delay element (350) is coupled to a digital filter (370). A digital filter may be hardware and/or software that includes functionality to produce a filter in the feedback loop produced using a PLL device (e.g., PLL device C (300)). Accordingly, a digital filter may include functionality to use the difference in phase between a reference signal (e.g., reference signal C (305)) and an input signal (e.g., filtered signal X (355)) obtained by a digital phase detector (e.g., digital phase detector X (361)). In one or more embodiments, for example, the digital filter (370) is an integrated circuit that includes functionality to store the difference in phase as various phase locked loop (PLL) noise measurements (375), such as in a hardware register. Using the stored PLL noise measurements (375), for example, the digital filter (370) may include functionality to generate a control signal (e.g., control signal Y (352)) for operating the delay element (350) on an input signal (e.g., filtered signal X (355)).

For example, the digital filter (370) may include a digital accumulator. Using the PLL noise measurements (375), for example, the digital accumulator may include functionality to produce a control signal Y (352) for operating the delay element (350). Control signal Y (352) may be similar to control signal A (151) described in FIG. 1 and the accompanying description.

The delay element (350) may include a steady-state detector (357). In particular, the delay element (350) may include functionality to operate only while an output signal is locked to a reference signal. Thus, the steady-state detector (357) may be hardware and/or software that includes functionality to determine whether the output signal C (380) is in a steady-state mode. In the steady-state mode, the phase and/or frequency of the output signal C (380) may be locked to the reference signal C (305). In other words, the amount of phase error and/or frequency error may have converged to a local minimum where the output signal C (380) is approximately constant with respect to the reference signal C (305). On the other hand, when the PLL device A (100) is in a transient mode, the PLL device C (300) may be adjusting the phase and/or frequency of the output signal C (380) to match the reference signal C (305).

Figure 4:
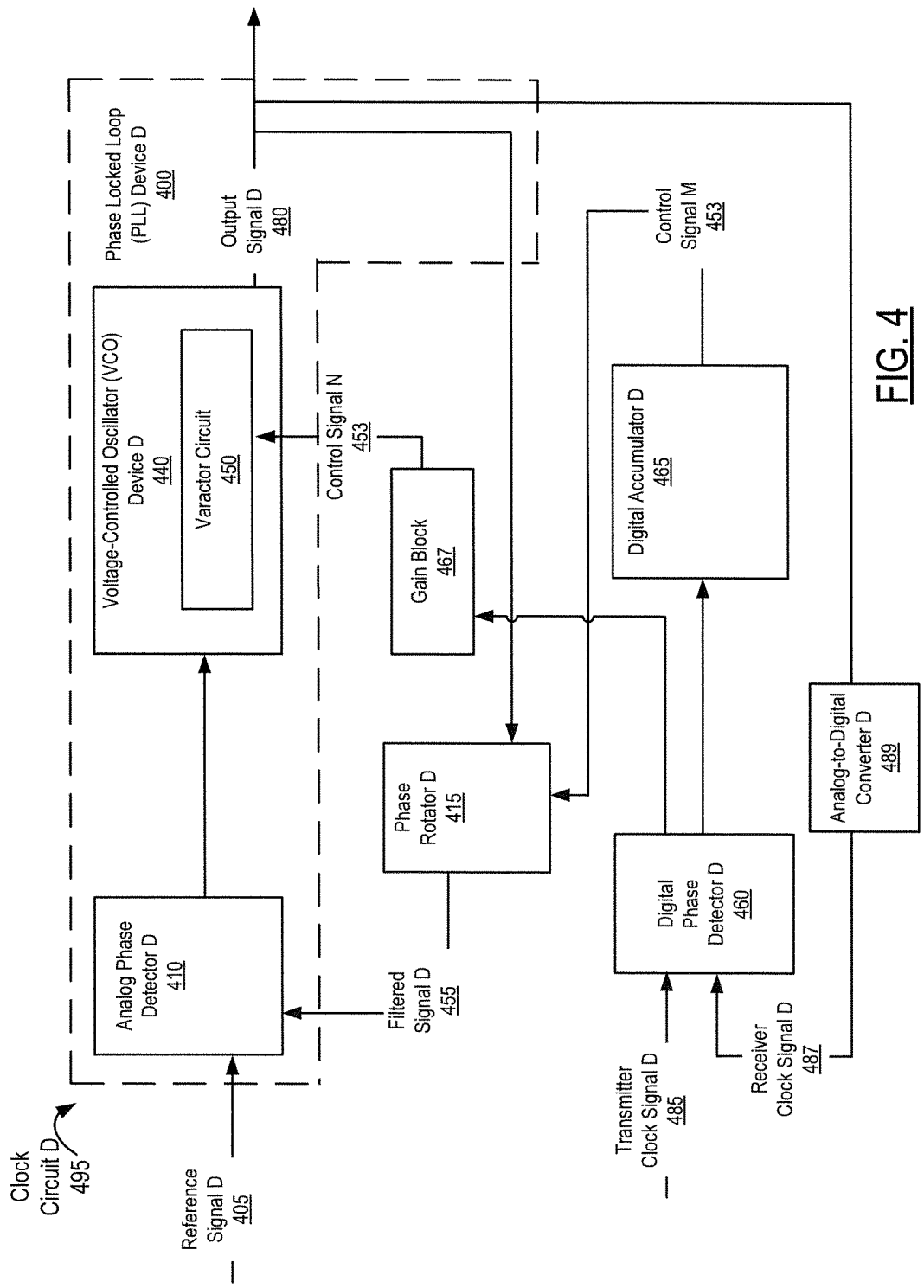

Turning to FIG. 4, FIG. 4 shows a block diagram of a system in accordance with one or more embodiments. As shown in FIG. 4, a clock circuit D (495) may include a PLL device D (400) that includes an analog phase detector D (410) and a VCO device D (440) that generates an output signal D (480). The PLL device D (400) may be coupled to a phase rotator D (415). The clock circuit D (495) may further include an analog-to-digital converter D (489) and a digital phase detector D (460) that obtains a transmitter clock signal D (485) and a receiver clock signal D (487). The digital phase detector D (460) may be coupled to a digital accumulator D (465) configured to generate a control signal M (453) for controlling the phase rotator D (415). Likewise, the phase rotator D (415) may generate a filtered signal D (455) that provides an input with the reference signal D (405) to the analog phase detector D (410). Furthermore, one or more components illustrated in FIG. 4 may be similar to one or more components described in FIG. 1 and the accompanying description (e.g., phase rotator D (415) may be similar to phase rotator A (115), digital phase detector D (460) may be similar to digital phase detector A (160), etc.).

In one or more embodiments, the clock circuit D (495) includes a varactor circuit (e.g., varactor circuit (450)) coupled to VCO device D (440). In one or more embodiments, for example, the varactor circuit (450) includes functionality to compensate the VCO device D (440) for error within the feedback loop of the PLL device D (400) produced by the phase rotator D (415). The varactor circuit may have a resolution of 5 to 10 parts per million (ppm), for example.

Specifically, a varactor circuit may include a capacitor, a varicap diode, and/or other circuit components that include functionality to generate a voltage-controlled variable capacitor. As such, the varactor circuit (450) may be coupled to a gain block (e.g., gain block (467)) that may be an amplifier. For example, the gain block (467) may transmit a control signal N (453) that causes the varactor circuit (450) to adjust the output signal D (480). Thus, the varactor circuit (450) may account for non-linearity exhibited by the phase rotator D (415). Moreover, the gain block (467) may be coupled to the digital phase detector D (460) that measures the amount of phase difference between the transmitter clock signal D (485) and the receiver clock signal D (487). In one or more embodiments, since the varactor circuit (450) is coupled to the VCO device D (440), the accumulation process of the varactor circuit (450) is intrinsic to the VCO device D (440). In other words, the VCO device D (440) may generate a frequency output signal with an intrinsic phase accumulation process, because the integration of frequency may provide for phase.

Figure 5:
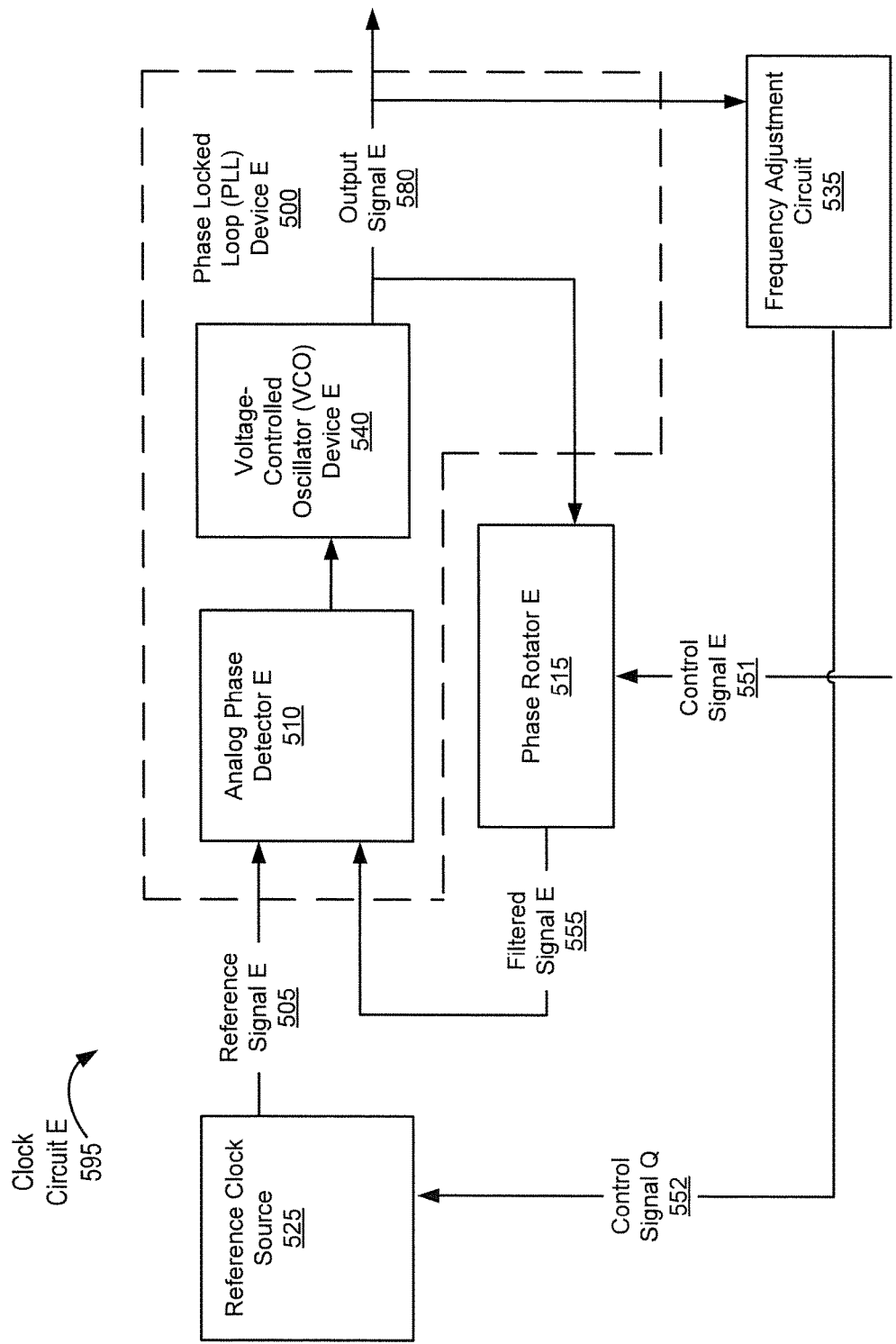

Turning to FIG. 5, FIG. 5 shows a block diagram of a system in accordance with one or more embodiments. As shown in FIG. 5, a clock circuit E (595) may include a PLL device E (500) that includes an analog phase detector E (510) and a VCO device E (540) that generates an output signal E (580). The PLL device E (500) may be coupled to a phase rotator E (515) that obtains a control signal E (551) similar to control signal A (151) described in FIG. 1 and the accompanying description. Likewise, the phase rotator E (515) may generate a filtered signal E (555) that provides an input with the reference signal E (505) to the analog phase detector E (510). The clock circuit E (595) may also include a reference clock source (525) similar to the reference clock described with respect to FIG. 1 and the accompanying description. Furthermore, one or more components illustrated in FIG. 5 may be similar to one or more components described in FIG. 1 and the accompanying description (e.g., phase rotator E (515) may be similar to phase rotator A (115), analog phase detector E (510) may be similar to analog phase detector A (510), etc.).

In one or more embodiments, a clock circuit (e.g., clock circuit E (595)) includes a frequency adjustment circuit (e.g., frequency adjustment circuit (535)) coupled to a PLL device (e.g., PLL device E (500)). For example, the frequency adjustment circuit (535) may include hardware and/or software that includes functionality to adjust the frequency of the reference signal E (505) generated by the reference clock source (525). In one or more embodiments, for example, the frequency adjustment circuit (535) may include a frequency counter coupled to the VCO device E (540) and the reference clock source (525). The frequency counter may determine a difference in frequency between the output signal E (580) and the reference signal E (505). Based on the frequency difference, the frequency adjustment circuit (535) may transmit a control signal (e.g., control signal Q (552)) to the reference clock source (525) that reduces or increases the frequency of the reference signal E (505). Thus, as the output signal E (580) tracks a transmitter clock signal, the frequency adjustment circuit (535) may reduce the frequency difference between a receiver clock signal and a transmitter clock signal to a specified margin.

While FIGS. 1-5 show various configurations of components, other configurations may be used without departing from the scope of the invention. For example, various components may be combined to create a single component. As another example, the functionality performed by a single component may be performed by two or more components. Accordingly, for at least the above-recited reasons, embodiments of the invention should not be considered limited to the specific arrangements of components and/or elements shown in FIGS. 1-5.

Figure 7:
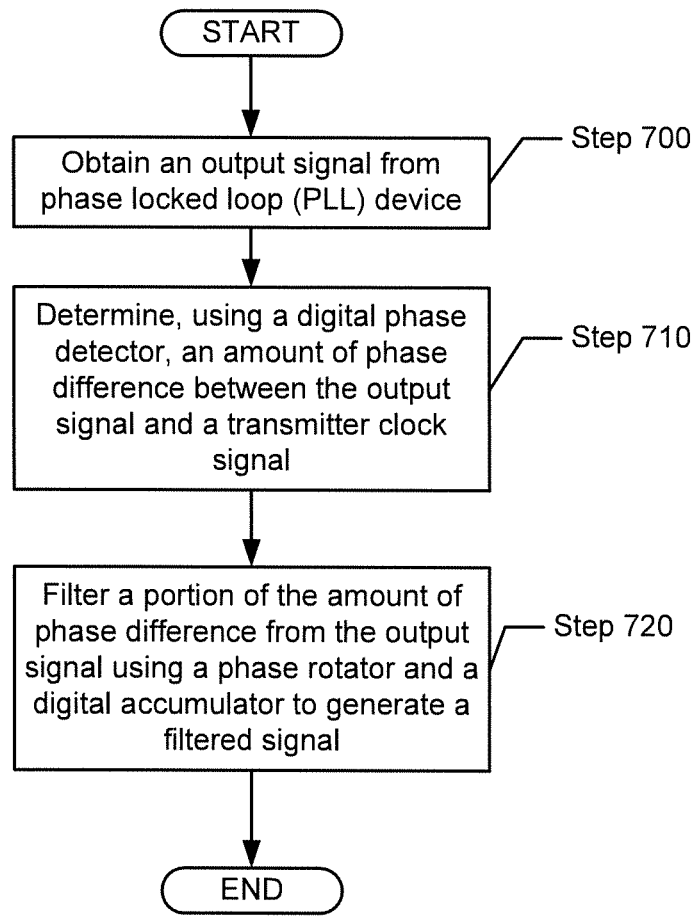
FIG. 7 shows a flowchart in accordance with one or more embodiments.

Turning to FIG. 7, FIG. 7 shows a flowchart in accordance with one or more embodiments. Specifically, one or more steps in FIG. 7 may be performed by one or more components as described in FIGS. 1-5. While the various steps in this flowchart are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 700, an output signal is obtained from a phase locked loop (PLL) device in accordance with one or more embodiments. For example, the output signal may be an extracted clock signal with the phase and/or frequency of the extracted clock signal matched to a reference clock signal. On the other hand, the output signal may be a feedback signal produced by a feedback divider in the PLL device. In one or more embodiments, the output signal is output signal A (180), output signal B (280), output signal C (380), output signal D (480), and/or output signal E (580) as described in FIGS. 1-5 and the accompanying description.

The PLL device may obtain the reference clock signal from a reference clock source, such as a global positioning system (GPS) signal with frequency and phase information. In one or more embodiments, the output signal in Step 700 is obtained after the PLL device enters a steady-state mode. In a steady-state mode, the PLL device is locked to the reference clock signal. While the output signal may be a direct output from a voltage-controlled oscillator inside the PLL device, the output signal may be a resulting signal from a feedback divider, for example.

In Step 710, an amount of phase difference is determined, using a digital phase detector, between an output signal and a transmitter clock signal in accordance with one or more embodiments. In one or more embodiments, for example, the transmitter clock signal is an embedded clock signal obtained at an optical transceiver. The transmitter clock signal may be obtained using a Godard digital phase detector, for example. In particular, the embedded optical signal may be obtained using various extraction algorithms, such as those that include Godard binning. Likewise, the output signal may be a receiver clock signal used by an optical receiver within the optical transceiver.

In one or more embodiments, the transmitter clock signal is an extracted clock signal from a SerDes system. In one or more embodiments, for example, the SerDes system is a PISO (Parallel Input, Serial Output) system that may include a parallel clock input, various data input lines, and various input data latches. As such, the SerDes system may use an internal or external PLL device to multiply an incoming parallel clock up to a specific frequency. In one or more embodiments, the SerDes system is a SIPO (Serial Input, Parallel Output) system. In a SIPO system, the receiver clock signal may be recovered from data obtained using a serial clock recovery technique.

In Step 720, a portion of an amount of phase difference from an output signal is filtered using a phase rotator and a digital accumulator to generate a filtered signal in accordance with one or more embodiments. In one or more embodiments, a phase rotator is placed within a feedback loop of a PLL device in a similar manner as described in FIGS. 1-5 and the accompanying description. In particular, the phase rotator may adjust the frequency offset between the transmitter clock signal from Step 710 and a receiver clock signal, such as the output signal from Step 700. In one or more embodiments, a non-linear compensation scheme is implemented in a clock circuit with the phase rotator to remove a portion of the PLL noise generated by the phase rotator.

Figure 8:
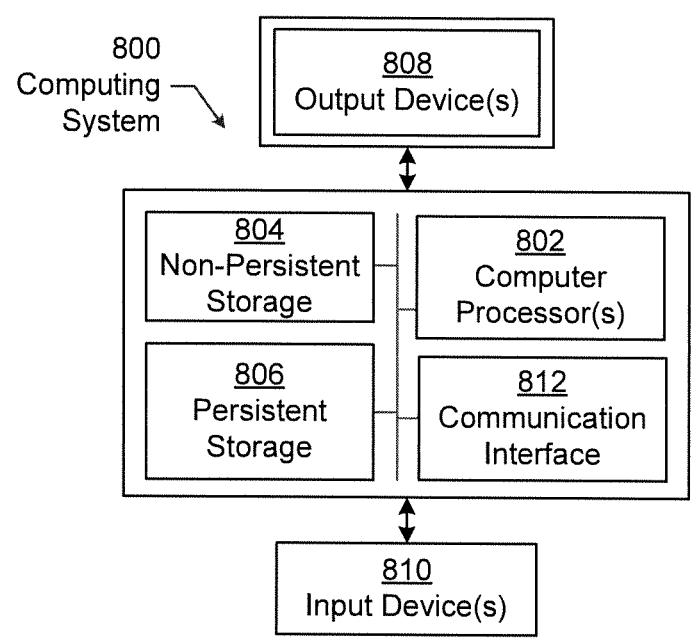
FIG. 8 shows a computing system in accordance with one or more embodiments.

Embodiments may be implemented on a computing system. Any combination of mobile, desktop, server, router, switch, embedded device, or other types of hardware may be used. For example, as shown in FIG. 8, the computing system (800) may include one or more computer processors (802), non-persistent storage (804) (e.g., volatile memory, such as random access memory (RAM), cache memory), persistent storage (806) (e.g., a hard disk, an optical drive such as a compact disk (CD) drive or digital versatile disk (DVD) drive, a flash memory, etc.), a communication interface (812) (e.g., Bluetooth interface, infrared interface, network interface, optical interface, etc.), and numerous other elements and functionalities.

The computer processor(s) (802) may be an integrated circuit for processing instructions. For example, the computer processor(s) may be one or more cores or micro-cores of a processor. The computing system (800) may also include one or more input devices (810), such as a touchscreen, keyboard, mouse, microphone, touchpad, electronic pen, or any other type of input device.

The communication interface (812) may include an integrated circuit for connecting the computing system (800) to a network (not shown) (e.g., a local area network (LAN), a wide area network (WAN) such as the Internet, mobile network, or any other type of network) and/or to another device, such as another computing device.

Further, the computing system (800) may include one or more output devices (808), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (802), non-persistent storage (804), and persistent storage (806). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the invention.

The computing system or group of computing systems described in FIG. 8 may include functionality to perform a variety of operations disclosed herein. For example, the computing system(s) may perform communication between processes on the same or different systems. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until the server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, only one authorized process may mount the shareable segment, other than the initializing process, at any given time.

Other techniques may be used to share data, such as the various data described in the present application, between processes without departing from the scope of the invention. The processes may be part of the same or different application and may execute on the same or different computing system.

Rather than or in addition to sharing data between processes, the computing system performing one or more embodiments of the invention may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments of the invention, may extract one or more data items from the obtained data. For example, the extraction may be performed as follows by the computing system (800) in FIG. 8. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 8, while performing one or more embodiments of the invention, may perform data comparison. Data comparison may be used to compare two or more data values (e.g., A, B). For example, one or more embodiments may determine whether $A>B$, $A=B$, $A!=B$, $A<B$, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if $A>B$, B may be subtracted from A (i.e., A−B), and the status flags may be read to determine if the result is positive (i.e., if $A>B$, then $A-B>0$). In one or more embodiments, B may be considered a threshold, and A is deemed to satisfy the threshold if $A=B$ or if $A>B$, as determined using the ALU. In one or more embodiments of the invention, A and B may be vectors, and comparing A with B requires comparing the first element of vector A with the first element of vector B, the second element of vector A with the second element of vector B, etc. In one or more embodiments, if A and B are strings, the binary values of the strings may be compared.

The computing system in FIG. 8 may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, a data container (e.g., database, table, record, column, view, etc.), identifier(s), conditions (e.g., comparison operators), functions (e.g. join, full join, count, average, etc.), sort (e.g., ascending, descending), or others. The DBMS may execute the statement. For example, the DBMS may access a memory buffer, a reference or index a file for reading, writing, deletion, or any combination thereof, for responding to the statement. The DBMS may load the data from persistent or non-persistent storage and perform computations to respond to the query. The DBMS may return the result(s) to the user or software application.

The computing system of FIG. 8 may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions present only a few examples of functions performed by the computing system of FIG. 8. Other functions may be performed using one or more embodiments of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A receiver apparatus, comprising:
   a phase locked loop (PLL) device that includes
      an analog phase detector configured to receive a reference signal, and
      a voltage-controlled oscillator (VCO) device, wherein the VCO device is configured to generate, based on the reference signal, an output signal;
   a phase rotator coupled to the VCO device and the analog phase detector;
   a digital phase detector coupled to the VCO device, the digital phase detector configured to determine an amount of phase difference between a transmitter clock signal and the output signal;
   a digital accumulator coupled to the digital phase detector, wherein the phase rotator and the digital accumulator are configured, using the amount of phase difference between the transmitter clock signal and the output signal, to filter a portion of the amount of phase difference from the output signal to generate a filtered signal for transmission to the analog phase detector; and
   a lookup table circuit coupled to the digital accumulator,
   wherein the lookup table circuit is configured to generate a control signal based on a value of the amount of phase difference between the transmitter clock signal and the output signal, and
   wherein the control signal is configured to produce, using the phase rotator, a predetermined phase shift in the filtered signal provided as a feedback signal within the PLL device.

2. The apparatus of claim 1,
   wherein the lookup table circuit is further configured to provide a plurality of values of the control signal that reduce PLL noise within the feedback loop of the PLL device, and
   wherein the plurality of values are based on measurements of corresponding phase adjustment steps within the feedback loop.

3. The apparatus of claim 1,
   wherein the digital phase detector is a Godard digital phase detector, and
   wherein the transmitter clock signal is extracted from a received signal using Godard binning.

4. The apparatus of claim 1,
   wherein the transmitter clock signal is extracted from a serializer-deserializer (SerDes) input signal.

5. The apparatus of claim 1,
   wherein the phase rotator decouples a clock recovery bandwidth from a bandwidth of the PLL device.

6. The apparatus of claim 1,
   wherein the output signal is a receiver clock signal within a transceiver.

7. A receiver apparatus, comprising:
   a phase locked loop (PLL) device that includes
      an analog phase detector configured to obtain a reference signal, and
      a voltage-controlled oscillator (VCO) device, wherein the VCO device is configured to generate, based on the reference signal, an output signal;
   a phase rotator coupled to the VCO device and the analog phase detector;
   a first digital phase detector coupled to the VCO device, the first digital phase detector being configured to determine an amount of phase difference between a transmitter clock signal and the output signal;
   a digital accumulator coupled to the first digital phase detector, wherein the phase rotator and the digital accumulator are configured, using the amount of phase difference between the transmitter clock signal and the output signal, to filter a portion of the amount of phase difference from the output signal to generate a filtered signal for transmission to the analog phase detector;
   a delay element coupled to the phase rotator and the analog phase detector;
   a second digital phase detector coupled to the delay element and the phase rotator, the second digital phase detector being configured to determine an amount of PLL noise based on the reference signal and the filtered signal; and
   a digital filter coupled to the second digital phase detector,
   wherein the delay element and the digital filter are configured, using the amount of PLL noise, to reduce a portion of the amount of PLL noise from the filtered signal.

8. The apparatus of claim 7,
wherein the delay element is a digitally programmable device configured to adjust a rising edge of the filtered signal using a control signal from the digital filter.

9. The apparatus of claim 7,
wherein the delay element and the digital filter are further configured to reduce the portion of the amount of PLL noise after the PLL device enters a steady-state mode.

10. The apparatus of claim 7,
wherein the first digital phase detector is a Godard digital phase detector, and
wherein the transmitter clock signal is extracted from a received signal using Godard binning.

11. The apparatus of claim 7,
wherein the transmitter clock signal is extracted from a serializer-deserializer (SerDes) input signal.

12. The apparatus of claim 7,
wherein the phase rotator decouples a clock recovery bandwidth from a bandwidth of the PLL device.

13. The apparatus of claim 7,
wherein the output signal is a receiver clock signal within a transceiver.

14. A receiver apparatus, comprising:
a phase locked loop (PLL) device that includes
 an analog phase detector configured to obtain a reference signal, and
 a voltage-controlled oscillator (VCO) device, wherein the VCO device is configured to generate, based on the reference signal, an output signal;
a phase rotator coupled to the VCO device and the analog phase detector;
a digital phase detector coupled to the VCO device, the digital phase detector being configured to determine an amount of phase difference between a transmitter clock signal and the output signal;
a digital accumulator coupled to the digital phase detector, wherein the phase rotator and the digital accumulator are configured, using the amount of phase difference between the transmitter clock signal and the output signal, to filter a portion of the amount of phase difference from the output signal to generate a filtered signal for transmission to the analog phase detector;
a reference clock source configured to generate the reference signal; and
a frequency counter coupled to the VCO device and the reference clock source,
wherein the frequency counter is configured to determine a frequency difference between a frequency of the reference clock source and a frequency of the VCO device, and
wherein the frequency counter is further configured to generate a control signal configured to change the frequency of the reference clock source based on the frequency difference.

15. The apparatus of claim 14,
wherein the reference clock source is a crystal oscillator.

16. The apparatus of claim 14,
wherein the frequency counter is further configured to reduce a frequency difference between a receiver clock signal from the reference clock source and a transmitter clock signal to be within a predetermined margin.

17. The apparatus of claim 14,
wherein the digital phase detector is a Godard digital phase detector, and
wherein the transmitter clock signal is extracted from an optical signal using Godard binning.

18. The apparatus of claim 14,
wherein the transmitter clock signal is extracted from a serializer-deserializer (SerDes) input signal.

19. The apparatus of claim 14,
wherein the phase rotator decouples a clock recovery bandwidth from a bandwidth of the PLL device.

20. The apparatus of claim 14,
wherein the output signal is a receiver clock signal within a transceiver.

\* \* \* \* \*